(12) United States Patent
Song

(10) Patent No.: US 11,988,702 B2
(45) Date of Patent: May 21, 2024

(54) METHOD AND SYSTEM FOR INSPECTION OF DEFECTIVE MTJ CELL IN STT-MRAM

(71) Applicant: Samsung Electronics Co., Ltd., Suwon-si (KR)

(72) Inventor: Yun Heub Song, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 891 days.

(21) Appl. No.: 17/044,185

(22) PCT Filed: Mar. 26, 2019

(86) PCT No.: PCT/KR2019/003490
§ 371 (c)(1),
(2) Date: Sep. 30, 2020

(87) PCT Pub. No.: WO2019/194450
PCT Pub. Date: Oct. 10, 2019

(65) Prior Publication Data
US 2021/0132134 A1  May 6, 2021

(30) Foreign Application Priority Data

Apr. 4, 2018 (KR) .................. 10-2018-0039035
Apr. 4, 2018 (KR) .................. 10-2018-0039036
Jan. 25, 2019 (KR) .................. 10-2019-0009649

(51) Int. Cl.
*G01R 31/12* (2020.01)
*G11C 11/16* (2006.01)
(Continued)

(52) U.S. Cl.
CPC ........ *G01R 31/1218* (2013.01); *G11C 11/161* (2013.01); *G11C 29/50* (2013.01); *H10N 50/10* (2023.02); *H10N 50/80* (2023.02)

(58) Field of Classification Search
CPC .... G01R 31/1218; G01R 33/00; H10N 50/80; H10N 50/10; G11C 11/161; G11C 29/50; G01B 7/004; G01C 17/38
See application file for complete search history.

(56) References Cited

U.S. PATENT DOCUMENTS 6,490,198 B2  12/2002  Yoshimura
7,525,166 B2   4/2009  Hosomi et al.
(Continued)

FOREIGN PATENT DOCUMENTS

CN      103299370        9/2013
JP      2004039183 A     2/2004
(Continued)

OTHER PUBLICATIONS

C.M.Choi et al., "Endurance of magnetic tunnel junctions under dynamic voltage stress," Electronics Letters. vol. 53, No. 16, Aug. 2017, pp. 1146-1148.
(Continued)

*Primary Examiner* — Jermele M Hollington
*Assistant Examiner* — Taqi R Nasir
(74) *Attorney, Agent, or Firm* — Fish & Richardson P.C.

(57) ABSTRACT

The present invention relates to a film quality inspection method and system for providing a stress evaluation scheme for inspection of film quality of a magnetic tunnel junction (MTJ) cell of spin-transfer torque magnetic random access memory (STT-MRAM), wherein a bipolar signal and a unipolar signal including a unipolar hole (positive polarity) and a unipolar electron (negative polarity) are simultaneously applied to the same MTJ cell, and then according to a result of a comparison of a cycling gap, the quality of a thin film having a thickness of about 1 nm may be inspected.

21 Claims, 19 Drawing Sheets

(51) Int. Cl.
    *G11C 29/50*     (2006.01)
    *H10N 50/10*     (2023.01)
    *H10N 50/80*     (2023.01)

(56) References Cited

U.S. PATENT DOCUMENTS

| | | | |
|---|---|---|---|
| 9,659,641 | B2 | 5/2017 | Kim et al. |
| 2005/0055621 | A1 | 3/2005 | Adelmann et al. |
| 2009/0086531 | A1 | 4/2009 | Yang et al. |
| 2015/0364187 | A1* | 12/2015 | Kim .................. G11C 11/1675 365/148 |
| 2016/0314826 | A1* | 10/2016 | Augustine ........... G11C 11/1657 |
| 2017/0358370 | A1 | 12/2017 | Mariani et al. |

FOREIGN PATENT DOCUMENTS

| | | | | | |
|---|---|---|---|---|---|
| KR | 100451598 | B1 | | 10/2004 | |
| KR | 1020070102940 | A | | 10/2007 | |
| KR | 100900131 | B1 | | 6/2009 | |
| KR | 101447819 | B1 | | 10/2014 | |
| KR | 20170076080 | A | * | 12/2015 | ............. G01R 31/28 |
| KR | 1020150144550 | A | | 12/2015 | |
| KR | 101774671 | B1 | | 9/2017 | |
| KR | 1020170140176 | A | | 12/2017 | |
| WO | 2017164229 | A1 | | 9/2017 | |

OTHER PUBLICATIONS

KR Notice of Allowance dated Sep. 30, 2019 issued in corresponding KR Application No. 10-2018-0039035.

KR Office Action dated Aug. 20, 2019 issued in corresponding KR Application No. 10-2018-0039036.

KR Office Action dated Jan. 9, 2020 issued in corresponding KR Application No. 10-2019-0009649.

Lee, Jung-min et al., "Thickness and Temperature Dependences of the degradation and the breakdown for MgO-based MAgnetic Tunnel Junctions," Apr. 16, 2015, Journal of the Korean Physical Society. vol. 66, No. 6,pp. 972-977.

Van Beek,S. et al., "Four Point Probe Ramped Voltage Stress as an Efficient Method to Understand Breakdown of STT-MRAM MgO Tunnel Junctions," 2015 IEEE International Reliability Physics symposium. sections I-III Jun. 1, 2015.

Kil et al., "Macro model for stochastic behavior of resistance distribution of magnetic tunnel junction," Japanese Journal of Applied Physics, 2015, 54(04DD12)1-7.

Lim et al., "Asymmetric dielectric breakdown behavior in MgO based magnetic tunnel junctions," Microelectronic Engineering, 2017, 178:308-312.

Office Action in Chinese Appln. No. 201980023620.8, dated Jul. 29, 2023, 24 pages (with English translation).

* cited by examiner

METHOD AND SYSTEM FOR INSPECTION OF DEFECTIVE MTJ CELL IN STT-MRAM

TECHNICAL FIELD

The present disclosure relates to a method and system for inspection of a defective magnetic tunnel junction (MTJ) cell in spin-transfer torque magnetic random access memory (STT-MRAM), and more particularly, to inspection of an MTJ cell of STT-MRAM.

BACKGROUND ART

Recently, spin-transfer torque magnetic random access memory (STT-MRAM) has been highlighted as next generation memory replacing dynamic random access memory (DRAM) and static RAM (SRAM). Therefore, semiconductor companies are conducting research and development into STT-MRAM and developing STT-MRAM as an embedded memory solution.

To successfully productize STT-MRAM, a property of screening a defective magnetic tunnel junction (MTJ) cell is very important. One of the causes of failure of a defective MTJ cell may be a defect involved in film quality of vulnerable dielectric thin film.

However, the film quality of an MTJ cell is not inspected in the existing phase of process development or productization, and after a cell is finally manufactured, whether a thin film is good or bad is determined according to cell characteristics. The film quality of an MTJ cell may be inspected in the phase of reliability evaluation, in which the inspection is performed by estimating an endurance characteristic based on bipolar cycling of an MTJ cell having bidirectional driving capability.

However, inspection methods using each phase described above have a limit to determine success or failure of development and potential defectiveness in terms of film quality of a dielectric thin film, and a technique of efficiently inspecting the quality of a thin film having a thickness of about 1 nm is desired.

DESCRIPTION OF EMBODIMENTS

Technical Problem

Provided is a technique of inspecting the quality of a thin film having a thickness of about 1 nm based on comparative evaluation of driving schemes during cycling.

Provided is a technique of simultaneously applying a bipolar signal and a unipolar signal, which includes a unipolar hole (positive polarity) and a unipolar electron (negative polarity), to the same magnetic tunnel junction (MTJ) cell and inspecting a good or bad thin film based on analysis of a cycling gap.

Provided is a technique of efficiently screening a defective MTJ cell by reducing a screening time and increasing screening accuracy by applying an incremental stepping pulse stress (ISPS) scheme, which has a different pulse condition and lead time, to each of a safe zone, a screen zone, and a nominal breakdown zone of spin-transfer torque magnetic random access memory (STT-MRAM) when screening the defective MTJ cell.

Provided is a method and system for inspection of a defective MTJ cell, by which the defective MTJ cell is screened using resistance variance of an MTJ cell, thereby providing an accurate screening result without influencing a good MTJ cell.

Solution to Problem

According to an aspect of the present disclosure, an inspection method of a system inspecting the reliability of dielectric film quality of a magnetic tunnel junction (MTJ) cell includes applying a unipolar signal and a bipolar signal to an MTJ cell of spin-transfer torque magnetic random access memory (STT-MRAM); comparing a cycling gap between a characteristic of the unipolar signal and a characteristic of the bipolar signal, the characteristics being generated from the MTJ cell; and inspecting a dielectric thin film of the MTJ cell based on a comparison result.

The applying of the unipolar signal and the bipolar signal may include simultaneously applying the unipolar signal and the bipolar signal to the MTJ cell of the STT-MRAM including a plurality of MTJ cells having a magnetic material, the unipolar signal including a unipolar hole (positive polarity) and a unipolar electron (negative polarity).

The unipolar signal and the bipolar signal may include interval time information indicating a time between different signals and signal time information indicating a time of a signal.

The comparing of the cycling gap between the characteristic of the unipolar signal and the characteristic of the bipolar signal may include obtaining the characteristic of the unipolar signal and the characteristic of the bipolar signal from a number of cycles with respect to the interval time information and comparing the cycling gap between the characteristic of the unipolar signal and the characteristic of the bipolar signal, the interval time information being generated from the MTJ cell having the unipolar signal and the bipolar signal applied thereto.

wherein the inspecting of the dielectric thin film of the MTJ cell may include inspecting a good thin film or a bad thin film at a point where the interval time information is equal to the signal time information according to the result of comparing the cycling gap between the characteristic of the unipolar signal and the characteristic of the bipolar signal.

The inspecting of the dielectric thin film of the MTJ cell may include inspecting a thin film of the MTJ cell as good when the cycling gap is greater than or equal to a preset value and as bad when the cycling gap is less than or equal to the preset value.

According to another aspect of the present disclosure, an inspection system for inspecting the reliability of dielectric film quality of an MTJ cell includes a signal application unit configured to apply a unipolar signal and a bipolar signal to an MTJ cell of STT-MRAM; a comparison unit configured to compare a cycling gap between a characteristic of the unipolar signal and a characteristic of the bipolar signal, the characteristics being generated from the MTJ cell; and an inspection unit configured to inspect a dielectric thin film of the MTJ cell based on a comparison result.

The signal application unit may be configured to simultaneously apply the unipolar signal and the bipolar signal to the MTJ cell of the STT-MRAM including a plurality of MTJ cells having a magnetic material, the unipolar signal including a unipolar hole (positive polarity) and a unipolar electron (negative polarity).

The comparison unit may be configured to obtain the characteristic of the unipolar signal and the characteristic of the bipolar signal from a number of cycles with respect to interval time information and to compare the cycling gap between the characteristic of the unipolar signal and the characteristic of the bipolar signal, the interval time information being generated from the MTJ cell having the unipolar signal and the bipolar signal applied thereto.

The inspection unit may be configured to inspect a good thin film or a bad thin film at a point where the interval time information is equal to signal time information according to the result of comparing the cycling gap between the characteristic of the unipolar signal and the characteristic of the bipolar signal.

The inspection unit may be configured to inspect a thin film of the MTJ cell as good when the cycling gap is greater than or equal to a preset value and as bad when the cycling gap is less than or equal to the preset value.

According to still another aspect of the present disclosure, an inspection method of a defective cell inspection system screening a defective MTJ cell includes applying an incremental stepping pulse stress (ISPS) scheme including a different pulse condition and a different lead time to each of a safe zone, a screen zone, and a nominal breakdown zone of STT-MRAM; and screening a defective MTJ cell of the STT-MRAM using the ISPS scheme.

The applying of the ISPS scheme may include differently applying the ISPS scheme to each of the safe zone, the screen zone, and the nominal breakdown zone, the screen zone having a possibility of existence of a defective cell, and the nominal breakdown zone having a possibility of occurrence of a breakdown of a normal cell.

The applying of the ISPS scheme may further include performing ramping using the ISPS scheme applying a relatively fast ramping speed to the safe zone and using the ISPS scheme applying a relatively slow ramping speed to the screen zone and applying the ISPS scheme to the nominal breakdown zone while applying a constant voltage and increasing a time variable.

The applying of the ISPS scheme may include performing the ramping on each of the safe zone and the screen zone using the ISPS scheme using a different ramping speed including a preset pulse condition, voltage, and lead time.

The screening of the defective MTJ cell may include screening the defective MTJ cell of the STT-MRAM using a different ISPS scheme, by which ramping is performed on each of the safe zone, the screen zone, and the nominal breakdown zone.

According to even another aspect of the present disclosure, an inspection method of a defective cell inspection system screening a defective MTJ cell includes applying, as a start voltage, a voltage of a preset pulse condition to each of a safe zone, a screen zone, and a nominal breakdown zone of STT-MRAM; applying an ISPS scheme including a different pulse condition and a different lead time to each of the safe zone, the screen zone, and the nominal breakdown zone; and screening a defective MTJ cell of the STT-MRAM using the ISPS scheme.

According to yet another aspect of the present disclosure, a defective cell inspection system for screening a defective MTJ cell includes an application unit configured to apply an ISPS scheme including a different pulse condition and a different lead time to each of a safe zone, a screen zone, and a nominal breakdown zone of STT-MRAM; and a screening unit configured to screen a defective MTJ cell of the STT-MRAM using the ISPS scheme.

The screening unit may include a safe zone application unit configured to perform ramping using the ISPS scheme applying a relatively fast ramping speed to the safe zone; a screen zone application unit configured to perform ramping using the ISPS scheme applying a relatively slow ramping speed to the screen zone; and a nominal breakdown zone application unit configured to apply the ISPS scheme to the nominal breakdown zone while applying a constant voltage and increasing a time variable.

The safe zone application unit and the screen zone application unit may be configured to perform the ramping on the safe zone and the screen zone, respectively, using ISPS schemes respectively using different ramping speeds including a preset pulse condition, voltage, and lead time.

The screening unit may be configured to screen the defective MTJ cell of the STT-MRAM using a different ISPS scheme, by which ramping is performed on each of the safe zone, the screen zone, and the nominal breakdown zone.

According to a further aspect of the present disclosure, an inspection method of a defective cell inspection system screening a defective MTJ cell includes reading stored data of an MTJ cell; detecting a resistance variance of the MTJ cell according to a result of reading the stored data and performing screening on the MTJ cell; and determining whether the MTJ cell is defective based on a screening result.

The detecting of the resistance variance and the performing of the screening on the MTJ cell may include detecting a variance in a resistance value of the MTJ cell compared to a preset reference value.

The determining of whether the MTJ cell is defective may include comparing the variance in the resistance value of the MTJ cell compared to the preset reference value with a defective cell decision value; and determining the MTJ cell as defective when the variance in the resistance value of the MTJ cell compared to the preset reference value is greater than or equal to the defective cell decision value; or determining the MTJ cell as non-defective when the variance in the resistance value of the MTJ cell compared to the preset reference value is less than the defective cell decision value.

The reading of the stored data of the MTJ cell may be performed in a hidden timing of the MTJ cell, the hidden timing referring to a timing in which the MTJ cell does not operate.

The detecting of the resistance variance and the performing of the screening on the MTJ cell may be performed when the stored data is read as a value corresponding to a high resistance state as a result of the reading.

The determining of whether the MTJ cell is defective may further include replacing the MTJ cell with a spare MTJ cell when the MTJ cell is determined to be defective.

According to a still further aspect of the present disclosure, a system for inspection of a defective MTJ cell includes a reading unit configured to read stored data of an MTJ cell; and a screening unit configured to detect a resistance variance of the MTJ cell according to a result of reading the stored data, to perform screening on the MTJ cell, and to determine whether the MTJ cell is defective based on a screening result.

The screening unit may be configured to detect a variance in a resistance value of the MTJ cell compared to a preset reference value.

The screening unit may be configured to compare the variance in the resistance value of the MTJ cell compared to the preset reference value with a defective cell decision value and to determine the MTJ cell as defective when the variance in the resistance value of the MTJ cell compared to the preset reference value is greater than or equal to the defective cell decision value or determine the MTJ cell as non-defective when the variance in the resistance value of the MTJ cell compared to the preset reference value is less than the defective cell decision value.

The reading unit may operate in a hidden timing of the MTJ cell and read the stored data of the MTJ cell, the hidden timing referring to a timing in which the MTJ cell does not operate.

The screening unit may operate when the stored data is read as a value corresponding to a high resistance state as a result of the reading and detect the resistance variance of the MTJ cell.

According to an even further aspect of the present disclosure, a method for inspection of a defective MTJ cell in STT-MRAM including a plurality of MTJ cells includes sequentially reading stored data of the plurality of MTJ cells; detecting a resistance variance of at least one MTJ cell among the plurality of MTJ cells according to a result of reading the stored data and performing screening on the at least one MTJ cell; and determining whether the at least one MTJ cell is defective based on a screening result.

The detecting of the resistance variance and the performing of the screening on the at least one MTJ cell may include detecting a variance in a resistance value of the at least one MTJ cell compared to a preset reference value.

The determining of whether the at least one MTJ cell is defective may include comparing the variance in the resistance value of the at least one MTJ cell compared to the preset reference value with a defective cell decision value; and determining the at least one MTJ cell as defective when the variance in the resistance value of the at least one MTJ cell compared to the preset reference value is greater than or equal to the defective cell decision value; or determining the at least one MTJ cell as non-defective when the variance in the resistance value of the at least one MTJ cell compared to the preset reference value is less than the defective cell decision value.

The sequential reading of the stored data of the plurality of MTJ cells may be performed in a hidden timing of the plurality of MTJ cells, the hidden timing referring to a timing in which the plurality of MTJ cells do not operate.

The detecting of the resistance variance and the performing of the screening on the at least one MTJ cell may be performed on the at least one MTJ cell having the stored data read as a value corresponding to a high resistance state as a result of the reading.

According to a yet further aspect of the present disclosure, a system for inspection of a defective MTJ cell in STT-MRAM including a plurality of MTJ cells includes a reading unit configured to sequentially read stored data of the plurality of MTJ cells; and a screening unit configured to detect a resistance variance of at least one MTJ cell among the plurality of MTJ cells according to a result of reading the stored data, to perform screening on the at least one MTJ cell, and to determine whether the at least one MTJ cell is defective based on a screening result.

Advantageous Effects of Disclosure

According to embodiments, the quality of a thin film having a thickness of about 1 nm may be inspected based on comparative evaluation of driving schemes during cycling.

According to embodiments, a bipolar signal and a unipolar signal including a unipolar hole (positive polarity) and a unipolar electron (negative polarity) are simultaneously applied to the same magnetic tunnel junction (MTJ) cell, and a good or bad thin film may be inspected based on analysis of a cycling gap.

According to embodiments, success or failure of development and potential defectiveness in terms of film quality of an MTJ cell may be determined in the phase of development, productization, or evaluation.

According to embodiments, a defective MTJ cell is screened by applying an incremental stepping pulse stress (ISPS) scheme, which has a different pulse condition and lead time, to each of a safe zone, a screen zone, and a nominal breakdown zone of spin-transfer torque magnetic random access memory (STT-MRAM), thereby reducing a screening time and increasing screening accuracy so that the defective MTJ cell may be efficiently screened.

According to embodiments, a defective MTJ cell may be more efficiently detected by variably adjusting the time as well as the amplitude of stress.

According to embodiments, there may be provided a method and system for inspection of a defective MTJ cell, by which the defective MTJ cell is screened using a resistance variance of an MTJ cell, thereby providing an accurate screening result without influencing a good MTJ cell.

BEST MODE

Figure 1:
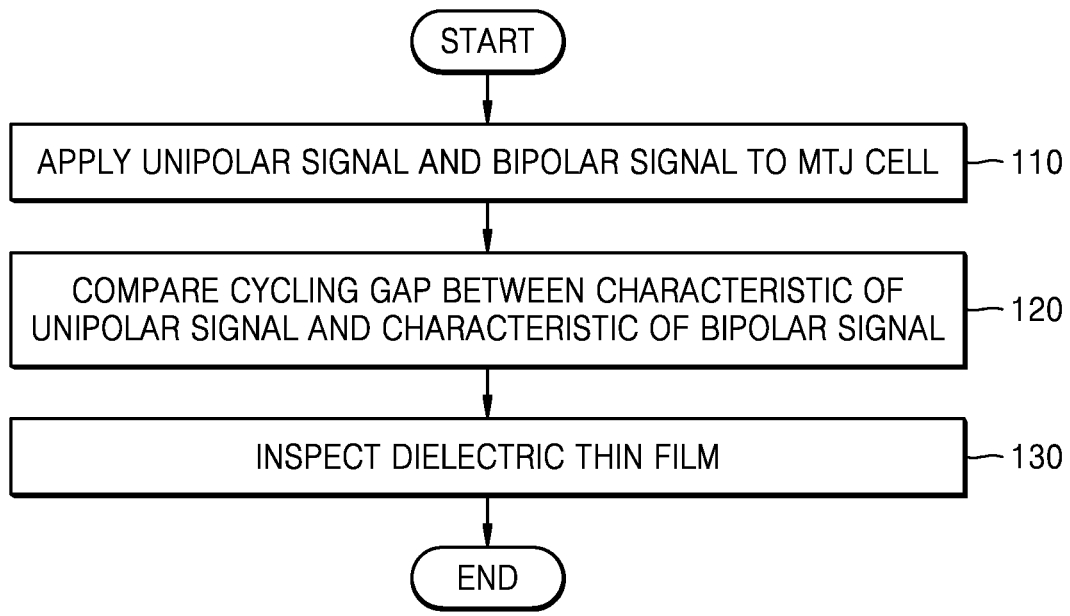
FIG. 1 is a flowchart of a film quality inspection method according to an embodiment of the present disclosure.

Hereinafter, embodiments will be described in detail with reference to the accompanying drawings. However, the present disclosure is not limited to the embodiments. In the drawings, like reference numerals denote like elements.

Figure 2:
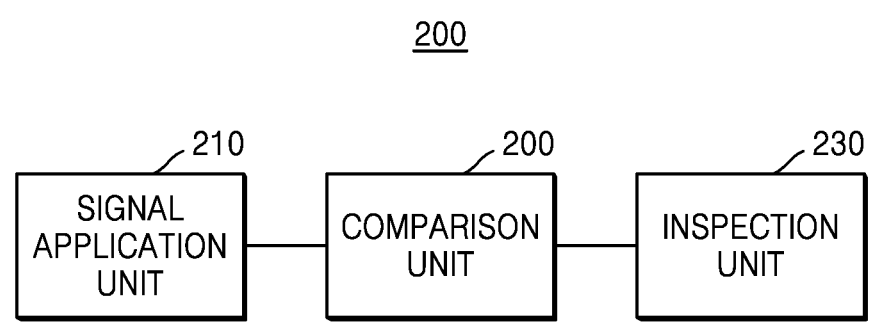
FIG. 2 is a detailed block diagram of a film quality inspection system according to an embodiment of the present disclosure.

FIG. 1 is a flowchart of a film quality inspection method according to an embodiment of the present disclosure, and FIG. 2 is a detailed block diagram of a film quality inspection system according to an embodiment of the present disclosure.

Referring to FIGS. 1 and 2, a film quality inspection method and system according to an embodiment provides a stress evaluation scheme for inspection of the film quality of a magnetic tunnel junction (MTJ) cell of spin-transfer torque magnetic random access memory (STT-MRAM).

To do this, according to an embodiment, a film quality inspection system 200 of FIG. 2 includes a signal application unit 210, a comparison unit 220, and an inspection unit 230. Operations 110 through 130 in FIG. 1 may be respectively performed by elements, i.e., the signal application unit 210, the comparison unit 220, and the inspection unit 230, of the film quality inspection system 200 of FIG. 2.

Referring to FIG. 1, the signal application unit 210 applies a unipolar signal and a bipolar signal to an MTJ cell of STT-MRAM in operation 110.

STT-MRAM includes a plurality of MTJ cells having a magnetic material. At this time, the structures, materials, shapes, and the like of the STT-MRAM and the MTJ cells are not limited.

The signal application unit 210 may simultaneously apply a unipolar signal, which includes a unipolar hole (positive polarity) and a unipolar electron (negative polarity), and a bipolar signal to the same MTJ cell of the STT-MRAM. In detail, the signal application unit 210 may set the same magnitude, cycle, time, and the like for the unipolar hole (unipolar+), the unipolar electron (unipolar-), and the bipolar signal and simultaneously apply the unipolar hole, the unipolar electron, and the bipolar signal to the same MTJ cell. According to an embodiment, at least one selected from the magnitude, cycle, and time of the unipolar hole, the unipolar electron, and the bipolar signal may be set to be ideal, and the unipolar hole, the unipolar electron, and the bipolar signal may be simultaneously applied to the same MTJ cell. In other words, the signal application unit 210 is characterized by simultaneously applying the unipolar signal and the bipolar signal to the same MTJ cell.

At this time, the same MTJ cell may be designated by a user or may be randomly designated at preset intervals and is thus not limited.

The unipolar and bipolar signals applied to an MTJ cell may include interval time information $\Delta t$ indicating a time between different signals and signal time information $\delta$ indicating the time of a signal. For example, a unipolar and a bipolar are digital signals representing content with existence or non-existence of a pulse or with a polarity. A unipolar hole (unipolar+) represents a pulse configuration corresponding to a voltage of mark +V[V] by matching the existence (mark) of a pulse with voltage +V[V] and matching non-existence (space) of a pulse with voltage 0[V]. A unipolar electron (unipolar-) represents a pulse configuration corresponding to a voltage of mark -V[V] by matching the existence (mark) of a pulse with voltage -V[V] and matching non-existence (space) of a pulse with voltage 0[V].

A bipolar represents a pulse configuration, in which voltage +V and voltage -V alternate with each other every time there is a mark, by matching the existence (mark) of a pulse with voltage +V[V] and -V[V] and matching non-existence (space) of a pulse with voltage 0[V].

The comparison unit 220 compares a cycling gap between a characteristic of the unipolar signal and a characteristic of the bipolar signal, which are generated from the MTJ cell, in operation 120.

The comparison unit 220 may obtain the characteristic of the unipolar signal and the characteristic of the bipolar signal from the number of cycles with respect to the interval time information, which is generated from the MTJ cell to which the unipolar signal and the bipolar signal have been applied, and may compare a cycling gap between the characteristic of the unipolar signal and the characteristic of the bipolar signal.

For example, the comparison unit 220 may obtain each of the characteristic of the unipolar signal and the characteristic of the bipolar signal, which indicate the number of cycles $N_{cycles}$ with respect to the interval time information $\Delta t$, and may compare a cycling gap between the characteristic of the unipolar signal and the characteristic of the bipolar signal.

The inspection unit 230 inspects a dielectric thin film of the MTJ cell based on a comparison result in operation 130.

The inspection unit 230 may inspect a good thin film (good dielectric film quality) or a bad thin film (bad dielectric film quality) according to the result of comparing the cycling gap between the characteristic of the unipolar signal and the characteristic of the bipolar signal, at a point where the interval time information $\Delta t$ is equal to the signal time information $\delta$, based on the characteristic of the unipolar signal and the characteristic of the bipolar signal, which indicate the number of cycles Ncycles with respect to the interval time information $\Delta t$.

For example, at the point where the interval time information $\Delta t$ is equal to the signal time information $\delta$, the inspection unit 230 may determine the thin film of the MTJ cell as good when the cycling gap between the characteristic of the unipolar signal and the characteristic of the bipolar signal is greater than or equal to a preset value and as bad when the cycling gap between the characteristic of the unipolar signal and the characteristic of the bipolar signal is less than or equal to the preset value. According to an embodiment, the inspection unit 230 may determine the thin film of the MTJ cell as good when the cycling gap is at least or exceeds the preset value and as bad when the cycling gap is below or at most the preset value.

Here, a criterion and range for determining a thing film of an MTJ cell as good or bad may vary with users setting standards or application areas. In addition, the preset value may be set by a user and may vary with the structures, material, shapes, and application areas of STT-MRAM and an MTJ cell and is thus not limited.

Figure 3:
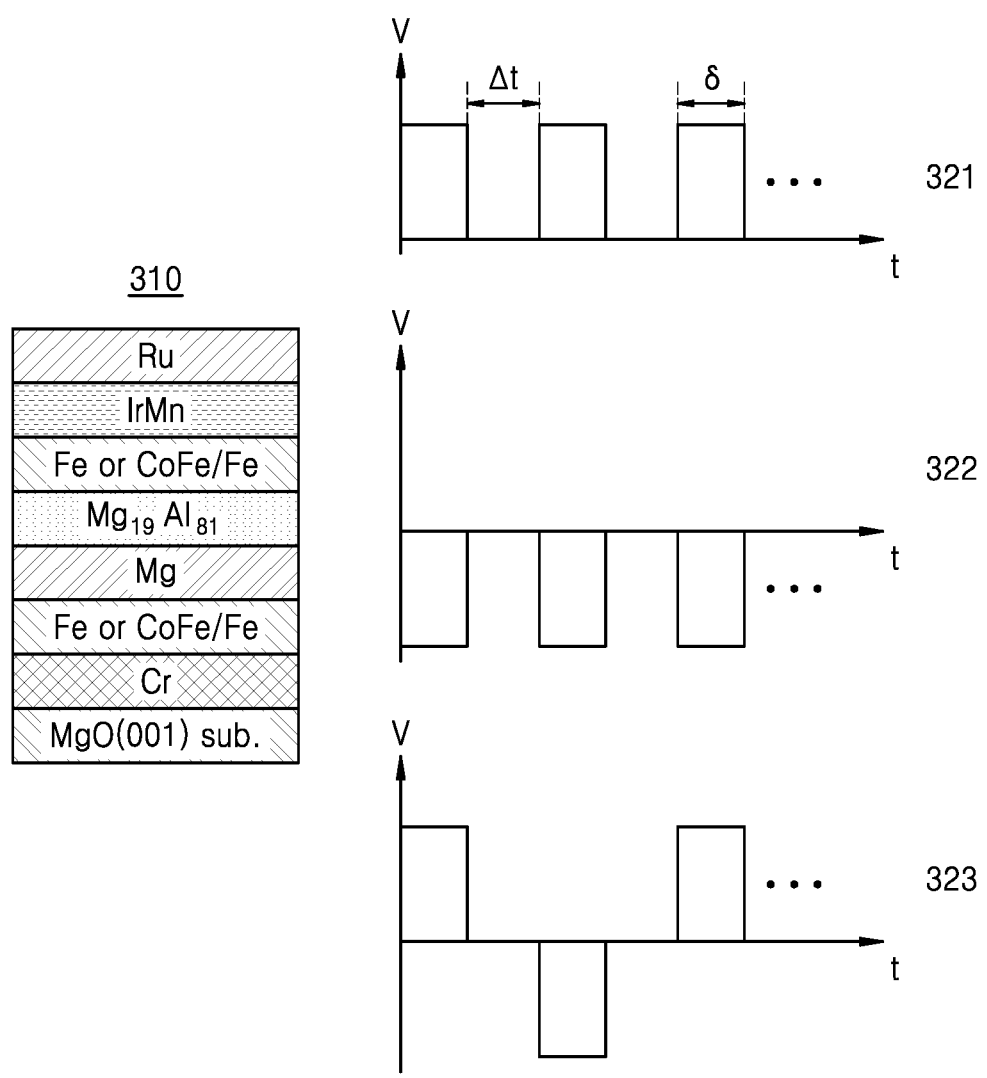
FIG. 3 illustrates a magnetic tunnel junction (MTJ) cell and stress conditions, according to an embodiment of the present disclosure.

FIG. 3 illustrates an MTJ cell and stress conditions, according to an embodiment of the present disclosure.

There are various methods of applying a pulse to an MTJ cell 310. In general, STT-MRAM applies stress using a bipolar method.

However, as shown in FIG. 3, a film quality inspection system according to an embodiment applies a unipolar signal 321, 322 and a bipolar signal 323 to the MTJ cell 310 of STT-MRAM. In other words, according to an embodiment, a film quality inspection system is characterized by simultaneously applying the stress of the unipolar signal 321, 322 and the stress of the bipolar signal 323 to the MTJ cell 310.

At this time, the unipolar signal is divided into a unipolar hole (unipolar+) 321 and a unipolar electron (unipolar−) 322, and the unipolar signal 321, 322 and the bipolar signal 323 may include the interval time information Δt indicating a time between different signals and the signal time information δ indicating a time of a signal.

Referring to FIG. 3, the MTJ cell 310 has a stacked form, but the structure, material, and shape of the MTJ cell 310 are not limited thereto.

The unipolar hole (unipolar+) 321 represents a pulse configuration corresponding to a voltage of mark +V[V] by matching the existence (mark) of a pulse with voltage +V[V] and matching non-existence (space) of a pulse with voltage 0[V]. The unipolar electron (unipolar−) 322 represents a pulse configuration corresponding to a voltage of mark −V[V] by matching the existence (mark) of a pulse with voltage −V[V] and matching non-existence (space) of a pulse with voltage 0[V]. The bipolar signal 323 represents a pulse configuration, in which voltage +V and voltage −V alternate with each other every time there is a mark, by matching the existence (mark) of a pulse with voltage +V[V] and −V[V] and matching non-existence (space) of a pulse with voltage 0[V].

According to an embodiment, a film quality inspection system is characterized by simultaneously applying the unipolar hole (unipolar+) 321, unipolar electron (unipolar−) 322, and the bipolar signal 323 to the MTJ cell 310, as shown in FIG. 3.

According to an embodiment, the power, magnitude, cycle, time, and the like of an applied signal are not limited and may be set by a user or may be ideally set according to predefined criteria or according to embodiments.

Figure 4:
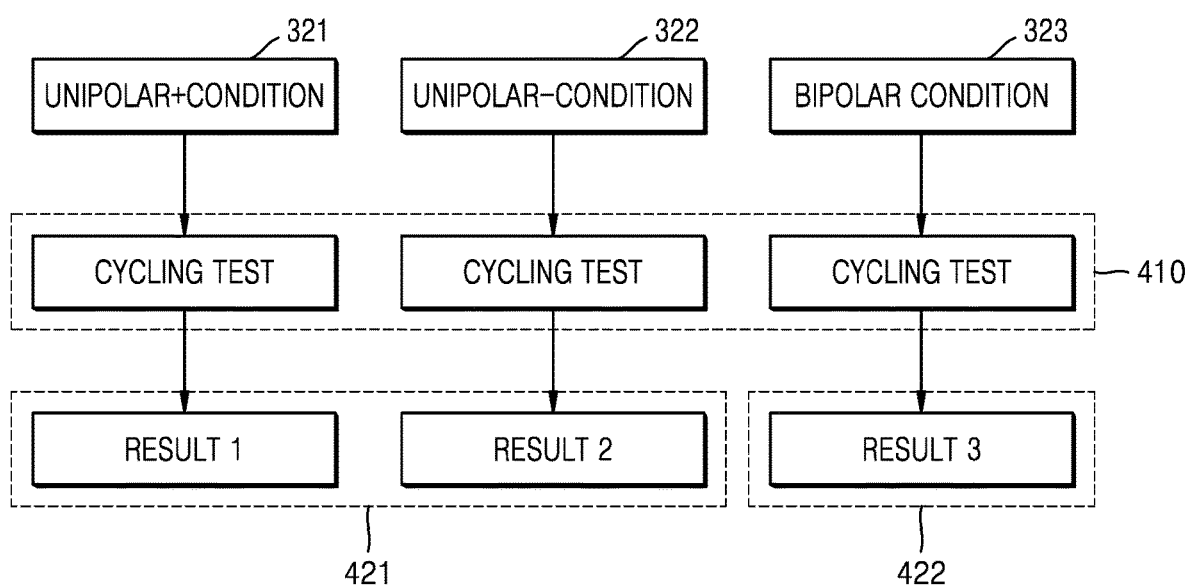
FIG. 4 illustrates a flowchart of a film quality inspection method and system according to an embodiment of the present disclosure.

FIG. 4 illustrates a flowchart of a film quality inspection method and system according to an embodiment of the present disclosure.

Referring to FIG. 4, according to an embodiment, a method and system for inspecting dielectric film quality of an MTJ cell simultaneously apply the unipolar hole (unipolar+) 321, the unipolar electron (unipolar−) 322, and the bipolar signal 323 to the same MTJ cell of STT-MRAM and (421 and 422) inspect a dielectric thin film of the MTJ cell through a cycling test 410.

At a point where the interval time information Δt is equal to the signal time information δ among pulse application conditions, the cycling test 410 compares a cycling gap between signal characteristics indicating the number of cycles $N_{cycles}$ in the interval time information Δt.

Thereafter, the method and system for inspecting dielectric film quality of an MTJ cell, according to the embodiment, may determine the thin film of the MTJ cell as good when a cycling gap between a characteristic 421 of a unipolar signal and a characteristic 422 of a bipolar signal is greater than or equal to a preset value of 103 and as bad when the cycling gap is less than or equal to the preset value of 103.

Figure 5:
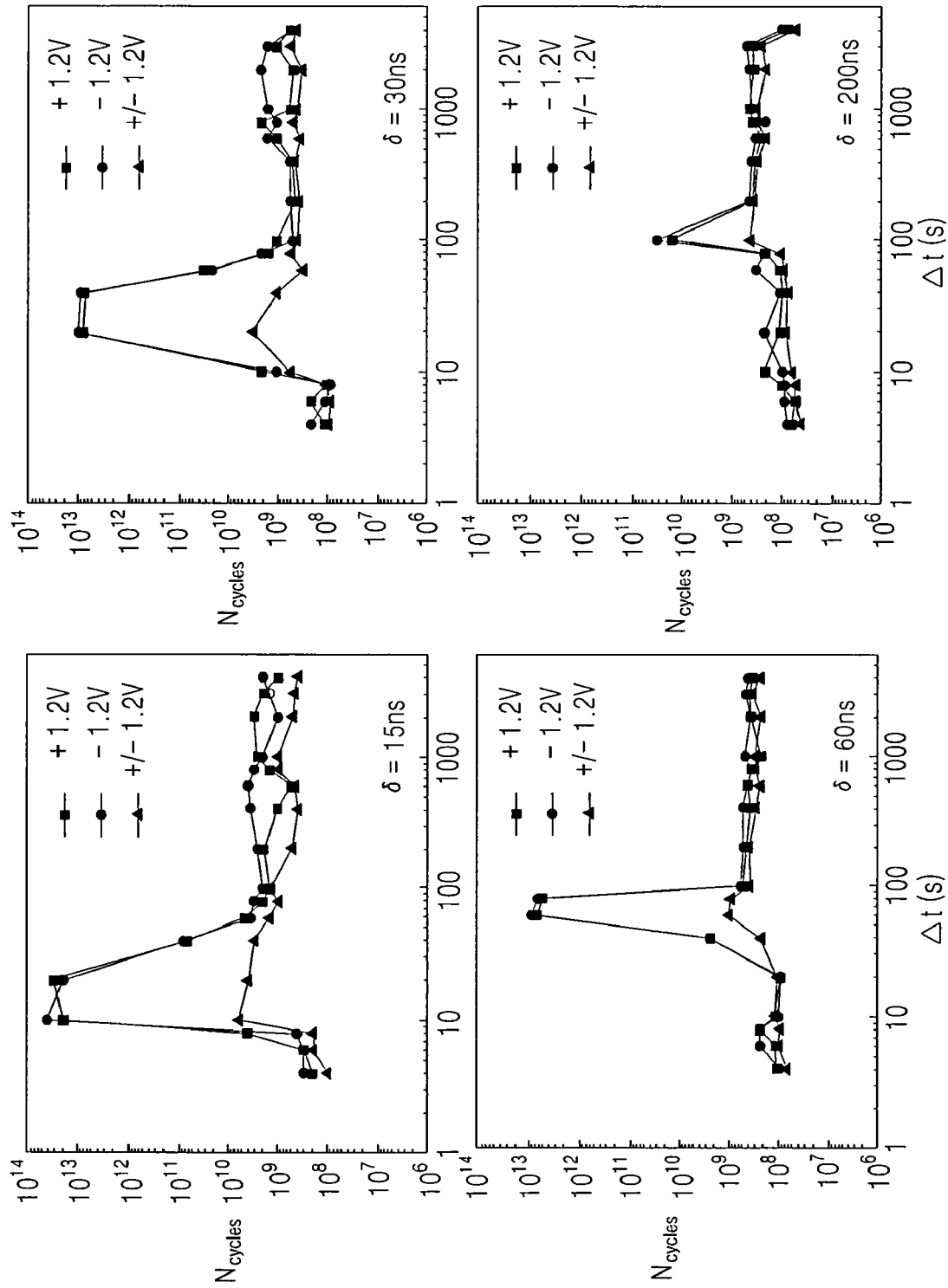
FIGS. 5 and 6 are graphs of an endurance characteristic of an MTJ cell having a good or bad thin film, according to an embodiment of the present disclosure.
Figure 6:
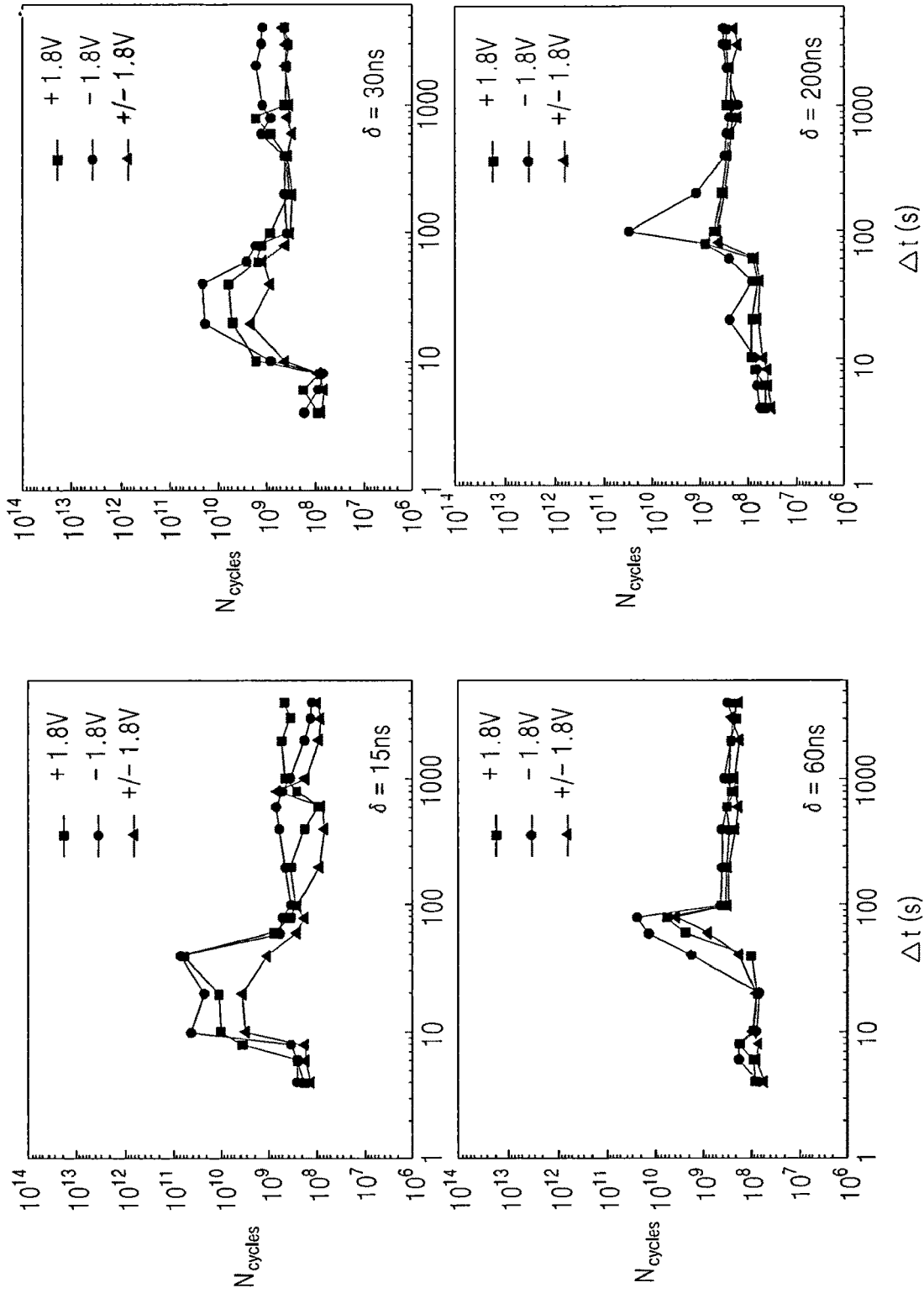

FIGS. 5 and 6 are graphs of an endurance characteristic of an MTJ cell having a good or bad thin film, according to an embodiment of the present disclosure.

In detail, FIG. 5 shows graphs of endurance characteristics of an MTJ cell having a good thin film, according to an embodiment; and FIG. 6 shows graphs of endurance characteristics of an MTJ cell having a bad thin film, according to the embodiment.

FIGS. 5 and 6 show graphs of endurance characteristics appearing after the stress of a unipolar hole (unipolar+), the stress of a unipolar electron (unipolar−), and the stress of a bipolar signal are applied to an MTJ cell in a method and system for inspecting dielectric film quality of the MTJ cell, according to the embodiment.

Referring to FIG. 5, when an MTJ cell has a good thin film, a cycling gap between the characteristic of a unipolar signal and the characteristic of a bipolar signal is greater than or equal to the preset value of 103 at a point where the interval time information Δt is equal to the signal time information δ.

Referring to FIG. 6, when an MTJ cell has a bad thin film, a cycling gap between the characteristic of a unipolar signal and the characteristic of a bipolar signal is less than or equal to the preset value of 103 at the point where the interval time information Δt is equal to the signal time information δ.

Consequently, in a method and system for inspecting dielectric film quality of an MTJ cell, according to an embodiment, a thin film of the MTJ cell is determined to be good when a cycling gap between the characteristic of a unipolar signal and the characteristic of a bipolar signal is greater than or equal to the preset value of 103 and is determined to be bad when the cycling gap is less than or equal to the preset value of 103.

At this time, each of the characteristic of the unipolar signal and the characteristic of the bipolar signal indicates the number of cycles in the interval time information Δt generated by a corresponding one of the unipolar signal and the bipolar signal, which are applied to the MTJ cell.

In other words, according to an embodiment, a method and system for inspecting dielectric film quality of an MTJ cell may identify a good or bad thin film of the MTJ cell according to a result of comparing the cycling gap between the characteristic of a unipolar signal and the characteristic of a bipolar signal.

Figure 7:
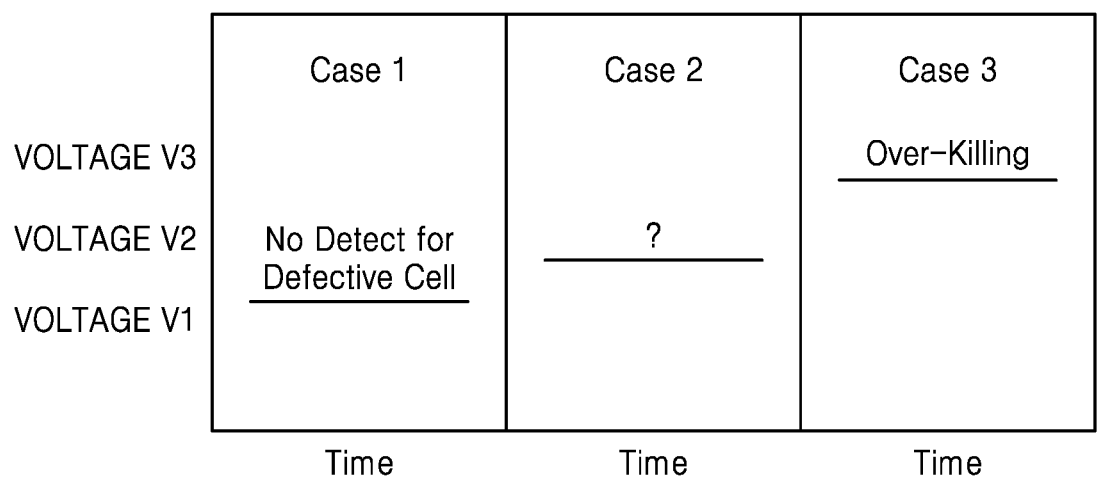
FIG. 7 is provided to describe a stress method of a screening technique according to the related art.

FIG. 7 is provided to describe a stress method of a screening technique according to the related art.

Referring to FIG. 7, when a constant current or voltage stress method of a screening technique according to the related art is used, a cell is screened in a short time, but the ability to discriminate between a defective cell and a good cell is very low and there is a serious over-killing problem.

In addition, in the case of a constant stress method, when a voltage is applied, it is very hard to set a voltage value, and because cells have different breakdown voltages as shown in FIG. 7, it is hard to detect a defective cell (No detect for defective cell) at a relatively low voltage and it is likely to detect a good cell as defective (Over-killing) at a relatively high voltage.

Therefore, to more efficiently screen a defective cell, a technique of variably adjusting a time as well as the amplitude of stress is required.

Figure 8:
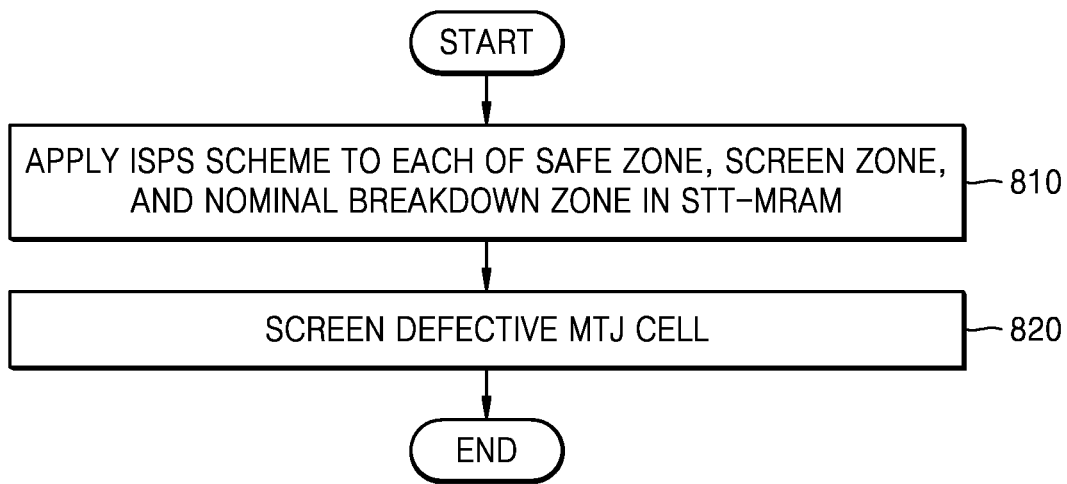
FIG. 8 is a flowchart of a method for inspection of a defective cell in spin-transfer torque magnetic random access memory (STT-MRAM), according to an embodiment of the present disclosure.
Figure 9:
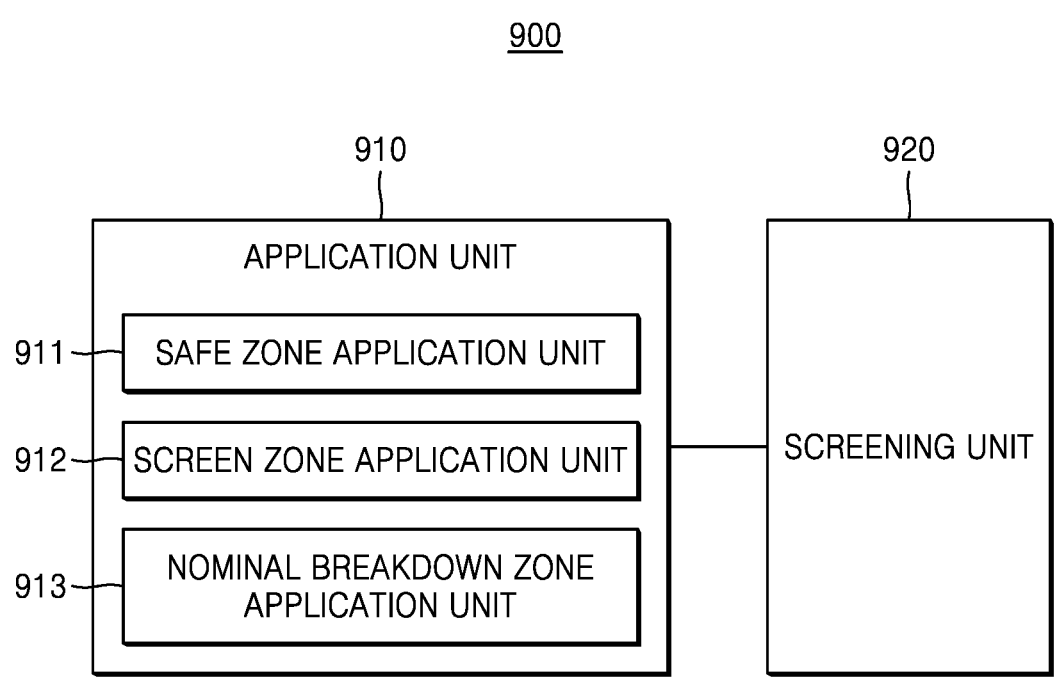
FIG. 9 is a detailed block diagram of a system for inspection of a defective cell in STT-MRAM, according to an embodiment of the present disclosure.

FIG. 8 is a flowchart of a method for inspection of a defective cell in STT-MRAM, according to an embodiment of the present disclosure; and FIG. 9 is a detailed block diagram of a system for inspection of a defective cell in STT-MRAM, according to an embodiment of the present disclosure.

Referring to FIGS. 8 and 9, according to an embodiment, a method and system for inspection of a defective cell in STT-MRAM apply an incremental stepping pulse stress (ISPS) scheme to each of a safe zone, a screen zone, and a nominal breakdown zone to screen a defective MTJ cell in STT-MRAM. At this time, to screen may include finding out a defective cell and replacing the defective cell with a good cell.

To screen, a system 900 of FIG. 9 for inspection of a defective cell in STT-MRAM, according to an embodiment, includes an application unit 910 and a screening unit 920. Operations 810 and 820 in FIG. 8 may be performed by the elements, i.e., the application unit 910 and the screening unit 920, of the system 900 of FIG. 9 for inspection of a defective cell in STT-MRAM.

Referring to FIG. 8, the application unit 910 applies an ISPS scheme, which includes a different pulse condition and a different lead time, to each of a safe zone, a screen zone, and a nominal breakdown zone in STT-MRAM in operation 810.

For example, the application unit 910 may apply, as a start voltage, a voltage meeting a preset pulse condition to each of a safe zone, a screen zone in which there may be a defective cell, and a nominal breakdown zone in which a breakdown of a normal cell may occur. At this time, the start voltage may have a change in percentage according to circumstances and may vary with a screening time, the magnitude of a ramp voltage, or the like.

After the start voltage is applied in operation 810, the application unit 910 may apply a ramp step voltage, which has a ramping speed including a different pulse condition and lead time, to each of the safe zone, the screen zone, and the nominal breakdown zone.

In detail, the application unit 910 may perform ramping using an ISPS scheme applying a relatively fast ramping speed to the safe zone and using an ISPS scheme applying a relatively slow ramping speed to the screen zone and may apply an ISPS scheme to the nominal breakdown zone while applying a constant voltage and increasing a time variable.

At this time, the ISPS scheme using a relatively fast ramping speed applied to the safe zone includes a rapidly increasing pulse amplitude and a lead time between amplitudes, and the ISPS scheme using a relatively slow ramping speed applied to the screen zone includes a slowly increasing pulse amplitude and a lead time between amplitudes. In other words, the application unit 910 may perform ramping on each of the safe zone and the screen zone using an ISPS scheme using a different ramping speed including a preset pulse condition, voltage, and lead time.

The application unit 910 may apply a voltage from a start voltage to a certain voltage, i.e., a breakdown voltage, to each of the safe zone, the screen zone, and the nominal breakdown zone using an ISPS scheme and may apply a voltage from the start voltage to the certain voltage with a ramp step voltage of 1.25 V to 1.70 V.

According to embodiments, a ramping speed used in an ISPS scheme may be determined taking into account a screening time, screening accuracy, or the like.

When the ISPS scheme using a ramping speed is applied to each of the safe zone, the screen zone, and the nominal breakdown zone in operation 810, the screening unit 920 screens a defective MTJ cell in STT-MRAM using the ISPS scheme.

The screening unit 920 may screen a defective MTJ cell in STT-MRAM using a different ISPS scheme, by which ramping is performed on each of the safe zone, the screen zone, and the nominal breakdown zone. At this time, to screen may include finding out a defective cell and replacing the defective cell with a good cell. In other words, according to an embodiment, the system 900 for inspection of a defective cell in STT-MRAM detects a resistance change in a hidden time, determines a current cell as defective when a high resistance is less than or equal to a preset value, and replaces the defective cell with a good cell (good MTJ), thereby completing screening.

Figure 10:
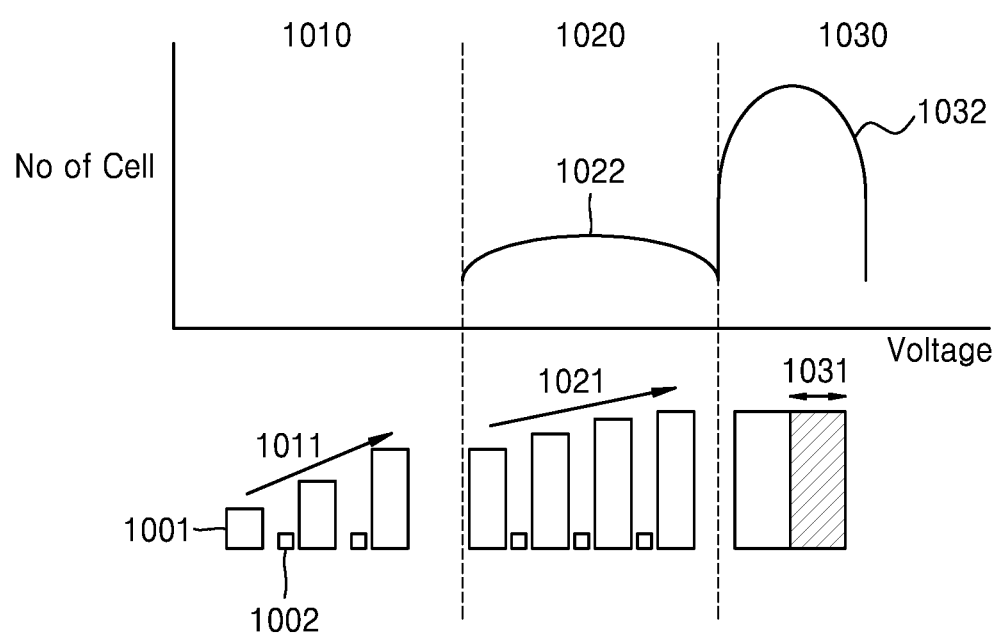
FIG. 10 illustrates an incremental stepping pulse stress (ISPS) screening method according to an embodiment of the present disclosure.

FIG. 10 illustrates an ISPS screening method according to an embodiment of the present disclosure.

Referring to FIG. 10, according to an embodiment, a method and system for inspection of a defective cell in STT-MRAM uses an ISPS scheme to efficiently screen a defective MTJ cell in STT-MRAM, statistically classifies breakdown zones into three zones, i.e., a safe zone 1010, a screen zone 1020 corresponding to a potential zone in which there may be a defective cell, and a nominal breakdown zone 1030 in which a breakdown of a normal cell may occur, and differently applies the ISPS scheme to each of the three zones.

According to an embodiment, a method and system for inspection of a defective cell in STT-MRAM may efficiently screen a defective MTJ cell by differently applying an ISPS scheme to each of three classified zones.

At this time, according to an embodiment, the system 900 for inspection of a defective cell in STT-MRAM may differently apply the ISPS scheme to each of the three classified zones through a safe zone application unit 911, a screen zone application unit 912, and a nominal breakdown zone application unit 913.

Referring to FIG. 10, in the system 900 for inspection of a defective cell in STT-MRAM, the safe zone application unit 911 may perform ramping using an ISPS scheme applying a relatively fast ramping speed 1011 to the safe zone 1010, and the screen zone application unit 912 may perform ramping using an ISPS scheme applying a relatively slow ramping speed 1021 to the screen zone 1020, which is a breakdown zone prone to have a defective MTJ cell. Accordingly, the system 900 for inspection of a defective cell in STT-MRAM screens a defective MTJ cell by stressing the ISPS scheme using the relatively fast ramping speed 1011 or the relatively slow ramping speed 1021.

Here, each of the ramping speed 1011 and 1021 may include a different shape of a pulse 1001 and a lead time 1002. The lead time 1002 is between pulses 1001, and the number, interval, range, or the like of lead times 1002 may be determined taking into account a screening time, screening accuracy, or the like.

In the system 900 for inspection of a defective cell in STT-MRAM, the nominal breakdown zone application unit 913 may perform ramping using an ISPS scheme applying a variable pulse width 1031 to the nominal breakdown zone 1030. For example, the system 900 for inspection of a defective cell in STT-MRAM screens a defective MTJ cell in the nominal breakdown zone 1030 by using a constant voltage and increasing a time 1031 instead of increasing a voltage. At this time, the screen zone 1020 shows a breakdown voltage (BV) distribution 1022 of a defective MTJ cell, and the nominal breakdown zone 1030 shows a BV distribution 1032 of a good MTJ cell.

In other words, according to an embodiment, a method and system for inspection of a defective cell in STT-MRAM may screen defective MTJ cells and good MTJ cells based on the BV distribution 1022 of a defective MTJ cell in the screen zone 1020 and the BV distribution 1032 of a good MTJ cell in the nominal breakdown zone 1030, as shown in FIG. 10.

Figure 11:
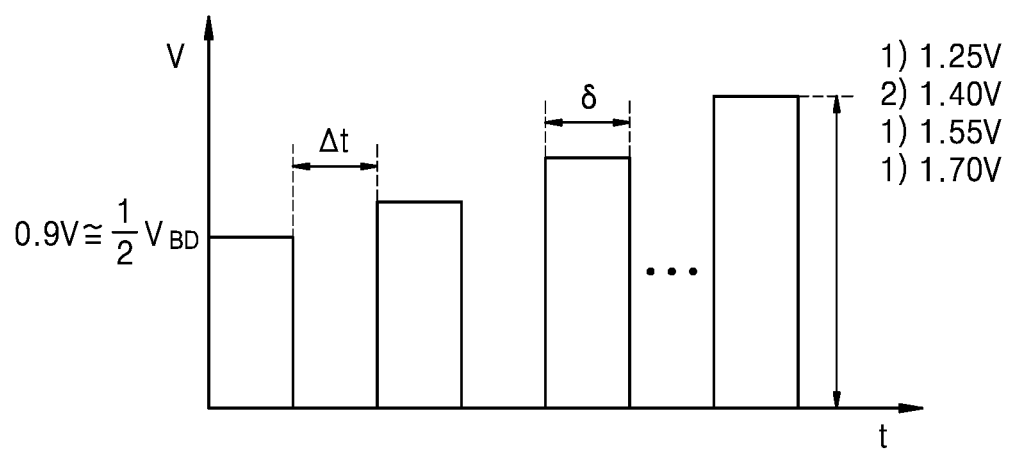
FIG. 11 illustrates pulse conditions according to an embodiment of the present disclosure.
Figure 12:
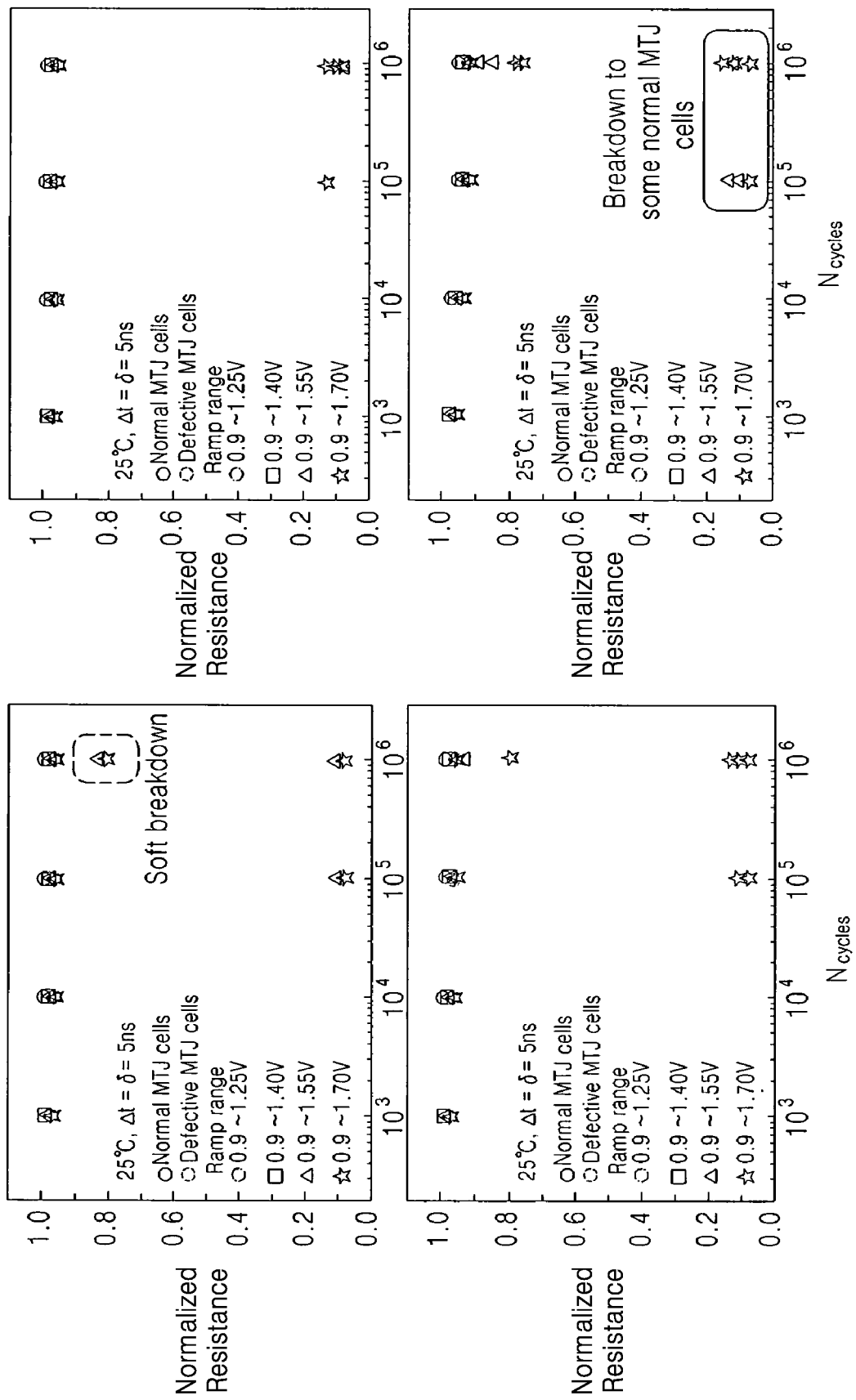
FIG. 12 illustrates experimental results on the screening endurance of a defective cell, according to an embodiment of the present disclosure.

FIG. 11 illustrates pulse conditions according to an embodiment of the present disclosure, and FIG. 12 illustrates experimental results on the screening endurance of a defective cell, according to an embodiment of the present disclosure.

FIG. 11 shows pulse conditions including a pulse width $\Delta t$ indicating a time between different signals and the signal time information $\delta$, which may mean interval, indicating a time of a signal. According to an embodiment, ISPS experiments were performed while increasing a voltage of a pulse condition from 1.25 V to 1.40 V, 1.55 V, and 1.70 V in a method and system for inspection of a defective cell in STT-MRAM According to ISPS experiment results, it may be proved that a defective MTJ cell is efficiently screened through an endurance test.

Figure 13:
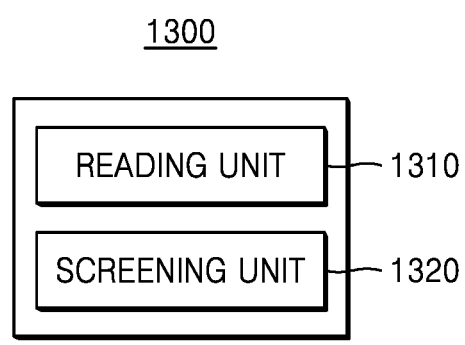
FIG. 13 is a block diagram of a system for inspection of a defective MTJ cell, according to an embodiment.
Figure 14:
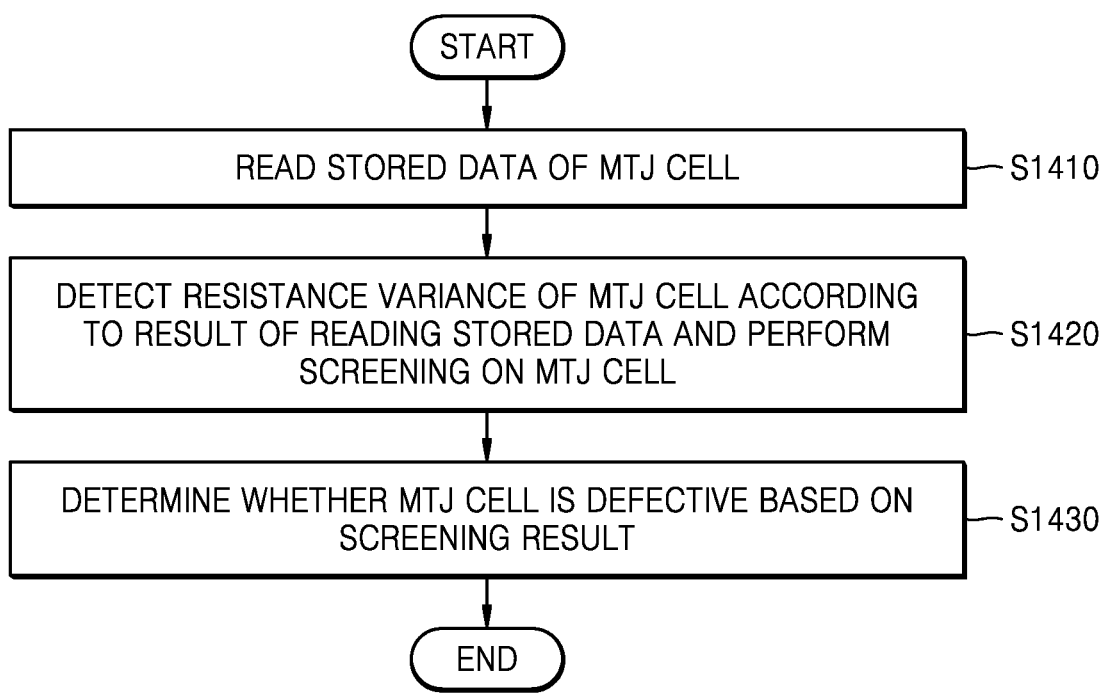
FIG. 14 is a flowchart of a method for inspection of a defective MTJ cell, according to an embodiment.
Figure 15:
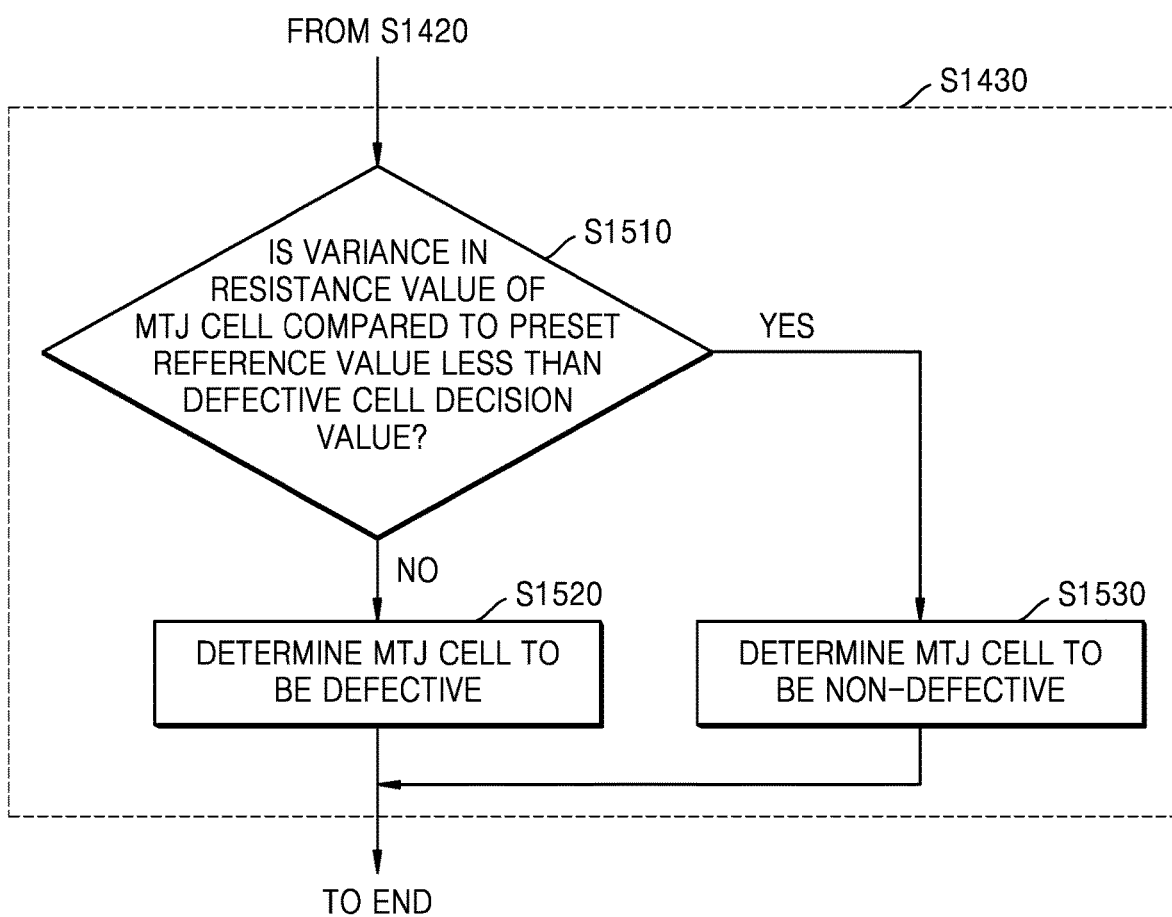
FIG. 15 is a detailed flowchart of operation S1430 in FIG. 14.
Figure 16:
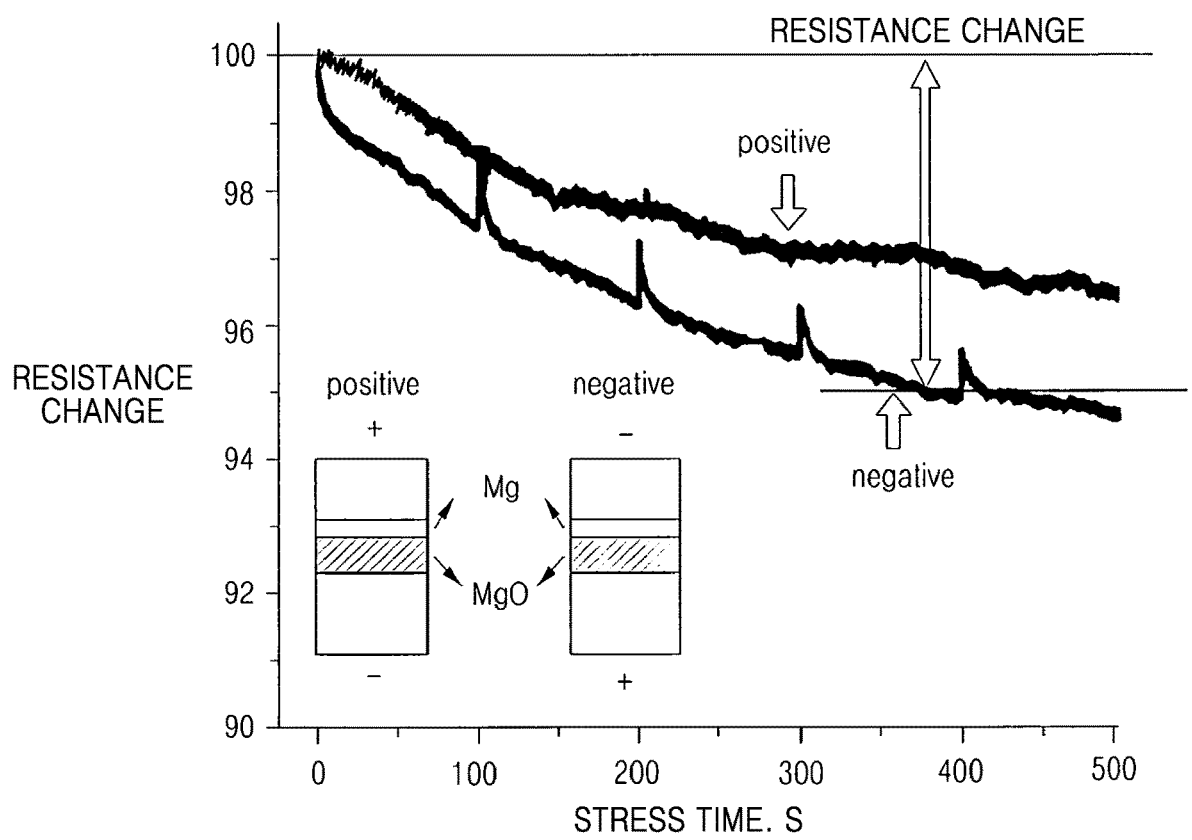
FIG. 16 is a diagram for describing the principle of a method for inspection of a defective MTJ cell, according to an embodiment.

FIG. 13 is a block diagram of a system for inspection of a defective MTJ cell, according to an embodiment; FIG. 14 is a flowchart of a method for inspection of a defective MTJ cell, according to an embodiment; FIG. 15 is a detailed flowchart of operation S1430 in FIG. 14; and FIG. 16 is a diagram for describing the principle of a method for inspection of a defective MTJ cell, according to an embodiment.

Referring to FIGS. 13 through 16, according to an embodiment, a system 1300 for inspection of a defective MTJ cell includes a reading unit 1310 and a screening unit 1320.

The reading unit 1310 reads stored data of an MTJ cell in operation S1410. In particular, the reading unit 1310 may perform operation S1410 in a hidden timing of the MTJ cell, wherein the hidden timing refers to a timing in which the MTJ cell does not operate, for example, does not perform a write operation, an erase operation, or the like. Because the reading unit 1310 performs operation S1410 in the hidden timing, operations S1420 and S1430 described below are also performed in the hidden timing so that power consumption may be reduced compared to techniques of screening in an operation timing according to the related art.

Thereafter, the screening unit 1320 detects a resistance variance of the MTJ cell according to a result of reading the stored data and performs screening on the MTJ cell in operation S1420. At this time, the performing of screening may include finding out a defective cell and replacing the defective cell with a good cell. In other words, according to an embodiment, the system 1300 for inspection of a defective MTJ cell detects a resistance variance in a hidden time, determines a current cell as defective when a high resistance is less than or equal to a preset value, and replaces the defective cell with a good MTJ cell, thereby completing screening.

In detail, the screening unit 1320 may perform screening on the MTJ cell by detecting a variance in a resistance value of the MTJ cell compared to a preset reference value in operation S1410. A normal MTJ cell has a resistance change with respect to an increase in stress time, as shown in FIG. 16, and an MTJ cell having a resistance change, which is greater than or equal to a certain value, with respect to the increase in stress time may potentially be defective. Accordingly, based on this principle, a defective MTJ cell inspection method according to an embodiment may perform screening based on a resistance variance of an MTJ cell when determining whether the MTJ cell is defective. Hereinafter, a defective MTJ cell refers to an MTJ cell which currently has a defect or is highly likely to have a defect potentially.

Here, the preset reference value may be set to an ideal value, which is obtained in a state where no stress is applied to an MTJ cell, but is not limited thereto and may be set to a random value that may be dramatically contrasted with a resistance value of an MTJ cell.

At this time, the screening unit 1320 may perform operation S1420 when the stored data of the MTJ cell is read as a value (e.g., [1]) corresponding to a high resistance state in operation S1410. When the stored data of the MTJ cell is read as a value (e.g., [0]) corresponding to a low resistance state in operation S1410, operation S1420 and operation S1430, which will be described below, may not be performed, and the screening unit 1320 may be deactivated so that the MTJ cell inspection method may end.

Thereafter, the screening unit 1320 determines whether the MTJ cell is defective based on a screening result in operation S1430. In detail, referring to FIG. 15, the screening unit 1320 may compare the variance in the resistance value of the MTJ cell compared to the preset reference value with a defective cell decision value in operation S1510, determine the MTJ cell as defective in operation S1520 when the variance in the resistance value of the MTJ cell compared to the preset reference value is greater than or equal to the defective cell decision value, and determine the MTJ cell as non-defective in operation S1530 when the variance in the resistance value of the MTJ cell compared to the preset reference value is less than the defective cell decision value.

At this time, the defective cell decision value is a variance in a resistance value compared to the preset reference value that MTJ cells have on average and may be experimentally determined.

In detailed examples of operations S1420 and S1430, in the case where the defective cell decision value corresponds to 5% reduction from the preset reference value, e.g., a resistance value of 100, when the variance in a resistance value of the MTJ cell, which is detected by the screening unit 1320, corresponds to 6% reduction from the preset reference value, e.g., a resistance value of 100, the MTJ cell may be determined to be defective. However, when the variance in a resistance value of the MTJ cell, which is detected by the screening unit 1320, corresponds to 4% reduction from the preset reference value, e.g., a resistance value of 100, the MTJ cell may be determined to be good.

When the MTJ cell is determined to be defective in operation S1430, the screening unit 1320 may replace the MTJ cell with a spare MTJ cell (not shown). Here, the spare MTJ cell may be an MTJ cell that has been screened and determined to be good through operations S1410 through S1430 before.

Although the screening method has been described with respect to a single MTJ cell, the screening method may also be applied to STT-MRAM including a plurality of MTJ cells. This will be described in detail below.

Figure 17:
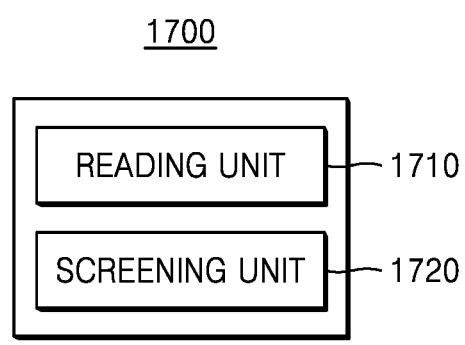
FIG. 17 is a block diagram of a system for inspection of a defective MTJ cell in STT-MRAM including a plurality of MTJ cells, according to an embodiment.
Figure 18:
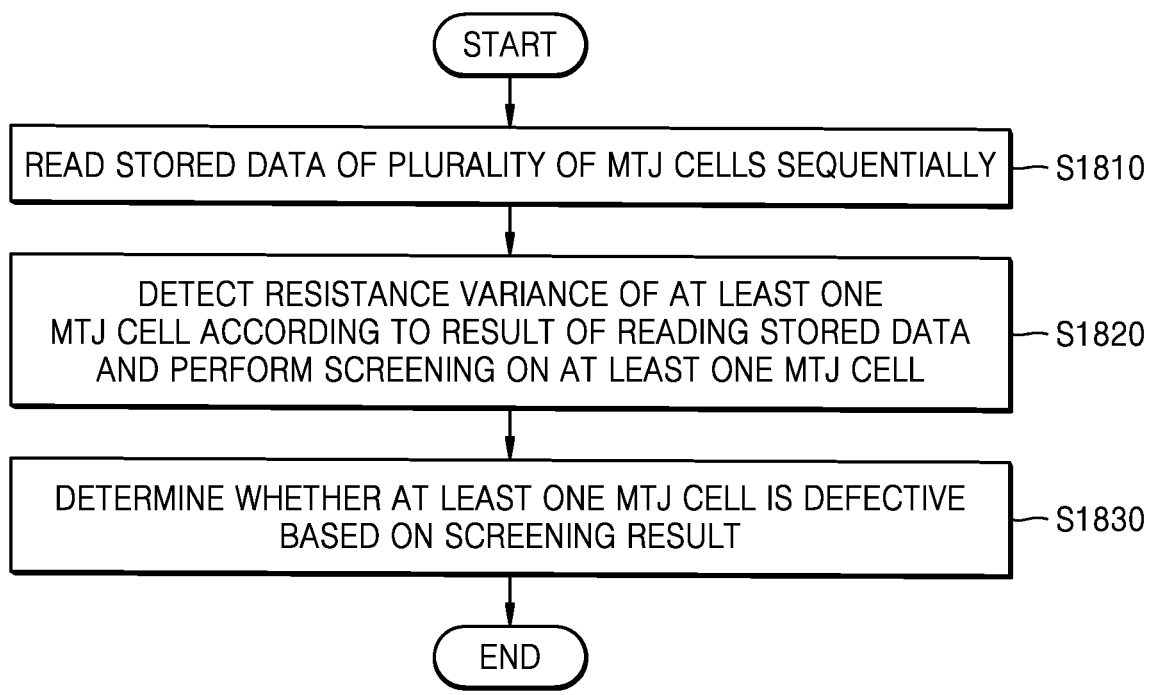
FIG. 18 is a flowchart of a method for inspection of a defective MTJ cell in STT-MRAM including a plurality of MTJ cells, according to an embodiment.

FIG. 17 is a block diagram of a system for inspection of a defective MTJ cell in STT-MRAM including a plurality of MTJ cells, according to an embodiment; FIG. 18 is a flowchart of a method for inspection of a defective MTJ cell in STT-MRAM including a plurality of MTJ cells, according to an embodiment; and FIG. 19 is a detailed flowchart of operation S1830 in FIG. 18.

Figure 19:
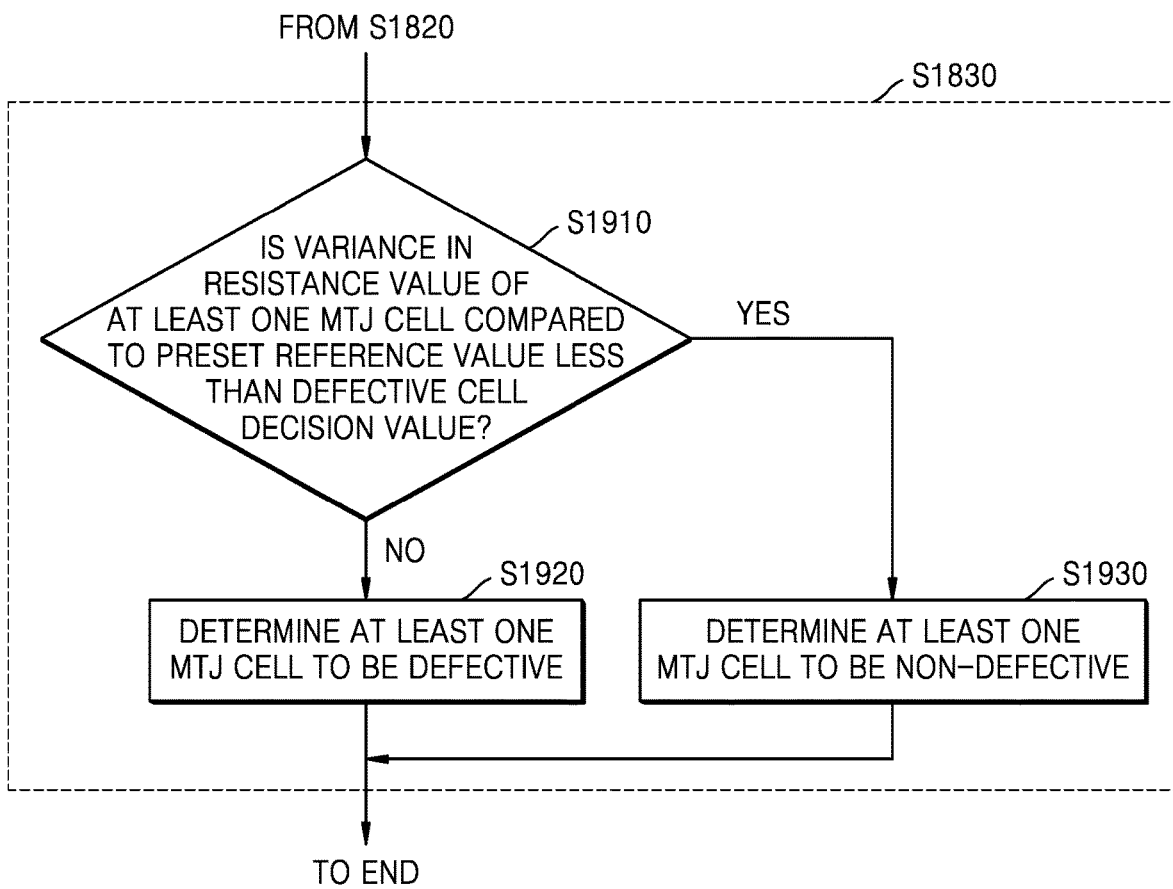
FIG. 19 is a detailed flowchart of operation S1830 in FIG. 18.

Referring to FIGS. 17 through 19, according to an embodiment, a system 1700 for inspection of a defective MTJ cell includes a reading unit 1710 and a screening unit 1720.

The reading unit 1710 sequentially reads stored data of a plurality of MTJ cells of STT-MRAM in operation S1810. In detail, the reading unit 1710 may sequentially read the stored data of the MTJ cells by way of reading the stored data of a first MTJ cell among the MTJ cells and subsequently reading the stored data of a second MTJ cell among the MTJ cells. In particular, the reading unit 1710 may perform operation S1810 in a hidden timing of the MTJ cells, wherein the hidden timing refers to a timing in which the MTJ cells do not operate, for example, do not perform a write operation, an erase operation, or the like. For example, the reading unit 1710 may perform operation S1810 in a hidden timing of STT-MRAM, in which all of the MTJ cells do not operate. In another example, the reading unit 1710 may perform operation S1810 on some MTJ cells, which do not operate, in the hidden timing of those MTJ cells excluding the remaining MTJ cells that are operating and may perform operation S1810 on the remaining MTJ cells in a hidden timing in which the remaining MTJ cells stop operating. Because the reading unit 1710 performs operation S1810 in the hidden timing, operations S1820 and S1830 described below are also performed in the hidden timing so that power consumption may be reduced compared to techniques of screening in an operation timing according to the related art.

Thereafter, the screening unit 1720 detects a resistance variance of at least one MTJ cell among the plurality of MTJ cells according to a result of reading the stored data and performs screening on the at least one MTJ cell in operation S1820. At this time, the performing of screening may include finding out a defective cell and replacing the defective cell with a good cell. In other words, according to an embodiment, the system 1700 for inspection of a defective MTJ cell detects a resistance variance in a hidden time, determines a current cell as defective when a high resistance is less than or equal to a preset value, and replaces the defective cell with a good MTJ cell, thereby completing screening.

In detail, the screening unit 1720 may perform screening on the at least one MTJ cell by detecting a variance in a resistance value of the at least one MTJ cell compared to a preset reference value in operation S1810.

Here, the preset reference value may be set to an ideal value, which is obtained in a state where no stress is applied to an MTJ cell, but is not limited thereto and may be set to a random value that may be dramatically contrasted with a resistance value of an MTJ cell.

At this time, the screening unit 1720 may perform operation S1820 when the stored data of the at least one MTJ cell is read as a value (e.g., [1]) corresponding to a high resistance state in operation S1810. When the stored data of the at least one MTJ cell is read as a value (e.g., [0]) corresponding to a low resistance state in operation S1810, operation S1820 and operation S1830, which will be described below, may not be performed, and the screening unit 1720 may be deactivated so that the MTJ cell inspection method may end.

Thereafter, the screening unit 1720 determines whether the at least one MTJ cell is defective based on a screening result in operation S1830. In detail, referring to FIG. 19, the screening unit 1720 may compare the variance in the resistance value of the at least one MTJ cell compared to the preset reference value with a defective cell decision value in operation S1910, determine the at least one MTJ cell as defective in operation S1920 when the variance in the resistance value of the at least one MTJ cell compared to the preset reference value is greater than or equal to the defective cell decision value, and determine the at least one MTJ cell as non-defective in operation S1930 when the variance in the resistance value of the at least one MTJ cell compared to the preset reference value is less than the defective cell decision value.

At this time, the defective cell decision value is a variance in a resistance value compared to the preset reference value that MTJ cells have on average and may be experimentally determined.

In detailed examples of operations S1820 and S1830, in the case where the defective cell decision value corresponds to 5% reduction from the preset reference value, e.g., a resistance value of 100, when the variance in a resistance value of a first MTJ cell, which is detected by the screening unit 1720, corresponds to 6% reduction from the preset reference value, e.g., a resistance value of 100, the first MTJ cell may be determined to be defective. However, when the variance in a resistance value of a second MTJ cell, which is detected by the screening unit 1720, corresponds to 4% reduction from the preset reference value, e.g., a resistance value of 100, the second MTJ cell may be determined to be good.

When the at least one MTJ cell is determined to be defective in operation S1830, the screening unit 1720 may replace the at least one MTJ cell with a spare MTJ cell. Here, the spare MTJ cell may be an MTJ cell that has been screened and determined to be good through operations S1810 through S1830 before.

MODE OF DISCLOSURE

While embodiments have been described with reference to particular embodiments and drawings, various changes and modifications may be made in the above descriptions by those of ordinary skill in the art. For example, even when the techniques described above are performed in a different order than described above, and/or the components such as systems, structure, devices, circuits, etc. described above are coupled to or combined with each other in different manners than described above or substituted or replaced with other components or equivalents, proper results may be obtained.

Therefore, other implements, other embodiments, and equivalents to the scope of the claims are included in the scope of the claims described below.

The invention claimed is:

1. An inspection method of a system inspecting reliability of dielectric film quality of a magnetic tunnel junction (MTJ) cell, the inspection method comprising:
   applying a unipolar signal and a bipolar signal to an MTJ cell of spin-transfer torque magnetic random access memory (STT-MRAM);
   comparing a cycling gap between a characteristic of the unipolar signal and a characteristic of the bipolar signal, the characteristics being generated from the MTJ cell; and
   inspecting a dielectric thin film of the MTJ cell based on a comparison result.

2. The inspection method of claim 1, wherein the applying of the unipolar signal and the bipolar signal includes simultaneously applying the unipolar signal and the bipolar signal to the MTJ cell of the STT-MRAM including a plurality of MTJ cells having a magnetic material, the unipolar signal including a unipolar hole (positive polarity) and a unipolar electron (negative polarity).

3. The inspection method of claim 1, wherein the unipolar signal and the bipolar signal include interval time information indicating a time between different signals and signal time information indicating a time of a signal.

4. The inspection method of claim 3, wherein the comparing of the cycling gap between the characteristic of the unipolar signal and the characteristic of the bipolar signal includes obtaining the characteristic of the unipolar signal and the characteristic of the bipolar signal from a number of cycles with respect to the interval time information and comparing the cycling gap between the characteristic of the unipolar signal and the characteristic of the bipolar signal, the interval time information being generated from the MTJ cell having the unipolar signal and the bipolar signal applied thereto.

5. The inspection method of claim 4, wherein the inspecting of the dielectric thin film of the MTJ cell includes inspecting a good thin film or a bad thin film at a point where the interval time information is equal to the signal time information according to the result of comparing the cycling gap between the characteristic of the unipolar signal and the characteristic of the bipolar signal.

6. The inspection method of claim 5, wherein the inspecting of the dielectric thin film of the MTJ cell includes inspecting a thin film of the MTJ cell as good when the cycling gap is greater than or equal to a preset value and as bad when the cycling gap is less than the preset value.

7. An inspection method of a system screening a defective magnetic tunnel junction (MTJ) cell, the inspection method comprising:
applying an incremental stepping pulse stress (ISPS) scheme including a different pulse condition and a different lead time to each of a safe zone, a screen zone, and a nominal breakdown zone of spin-transfer torque magnetic random access memory (STT-MRAM); and
screening a defective MTJ cell of the STT-MRAM using the ISPS scheme.

8. The inspection method of claim 7, wherein the applying of the ISPS scheme includes differently applying the ISPS scheme to each of the safe zone, the screen zone, and the nominal breakdown zone, the screen zone having a possibility of existence of a defective cell, and the nominal breakdown zone having a possibility of occurrence of a breakdown of a normal cell.

9. The inspection method of claim 8, wherein the applying of the ISPS scheme further includes performing ramping using the ISPS scheme applying a relatively fast ramping speed to the safe zone and using the ISPS scheme applying a relatively slow ramping speed to the screen zone and applying the ISPS scheme to the nominal breakdown zone while applying a constant voltage and increasing a time variable.

10. The inspection method of claim 9, wherein the applying of the ISPS scheme further includes performing the ramping on each of the safe zone and the screen zone using the ISPS scheme using a different ramping speed including a preset pulse condition, voltage, and lead time.

11. The inspection method of claim 9, wherein the screening of the defective MTJ cell includes screening the defective MTJ cell of the STT-MRAM using a different ISPS scheme, by which ramping is performed on each of the safe zone, the screen zone, and the nominal breakdown zone.

12. The inspection method of claim 7, wherein the applying of the ISPS scheme further includes
applying, as a start voltage, a voltage of a preset pulse condition to each of the safe zone, the screen zone, and the nominal breakdown zone of the STT-MRAM.

13. An inspection method of a system screening a defective magnetic tunnel junction (MTJ) cell, the inspection method comprising:
reading stored data of an MTJ cell;
detecting a resistance variance of the MTJ cell according to a result of reading the stored data of the MTJ cell and performing screening on the MTJ cell to provide a screening result; and
determining whether the MTJ cell is defective based on the screening result,
wherein the detecting of the resistance variance and the performing of the screening on the MTJ cell is performed when the stored data on the MTJ cell is read as a value corresponding to a high resistance state of the MTJ cell as a result of the reading.

14. The inspection method of claim 13, wherein the detecting of the resistance variance and the performing of the screening on the MTJ cell includes detecting a variance in a resistance value of the MTJ cell compared to a preset reference value.

15. The inspection method of claim 14, wherein the determining of whether the MTJ cell is defective includes:
comparing the variance in the resistance value of the MTJ cell compared to the preset reference value with a defective cell decision value;
and
determining the MTJ cell as defective when the variance in the resistance value of the MTJ cell compared to the preset reference value is greater than or equal to the defective cell decision value; or
determining the MTJ cell as non-defective when the variance in the resistance value of the MTJ cell compared to the preset reference value is less than the defective cell decision value.

16. The inspection method of claim 13, wherein the reading of the stored data of the MTJ cell is performed in a hidden timing of the MTJ cell, the hidden timing being a timing in which the MTJ cell does not operate.

17. The inspection method of claim 13, wherein the determining of whether the MTJ cell is defective further includes replacing the MTJ cell with a spare MTJ cell when the MTJ cell is determined to be defective.

18. The inspection method of claim 13, wherein the MTJ cell is one of a plurality of MTJ cells,
wherein the detecting of the resistance variance and the performing of the screening on the MTJ cell includes detecting a variance in a resistance value of at least one of the plurality of MTJ cells compared to a preset reference value.

19. The inspection method of claim 13, wherein the MTJ cell is one of a plurality of MTJ cells,
wherein the detecting of the resistance variance and the performing of the screening on the MTJ cell is performed on at least one MTJ cell of the plurality of MTJ cells having the stored data read as the value corresponding to the high resistance state of the at least one MTJ cell as the result of the reading.

20. The inspection method of claim 13, wherein the MTJ cell is included in a spin-transfer torque magnetic random access memory (STT-MRAM).

21. The inspection method of claim 19, wherein the at least one of the plurality of MTJ cells is included in a spin-transfer torque magnetic random access memory (STT-MRAM).

* * * * *